Oct. 18, 1960 P. ROBINSON 2,956,909

PROCESS FOR PRODUCING A CONDUCTIVE LAYER ON HEAT SENSITIVE DIELECTRIC MATERIAL

Filed June 11, 1956

INVENTOR.
PRESTON ROBINSON
BY
Roland A. Dexter
HIS ATTORNEY

United States Patent Office 2,956,909

Patented Oct. 18, 1960

2,956,909

PROCESS FOR PRODUCING A CONDUCTIVE LAYER ON HEAT SENSITIVE DIELECTRIC MATERIAL

Preston Robinson, Williamstown, Mass., assignor to Sprague Electric Company, North Adams, Mass., a corporation of Massachusetts Filed June 11, 1956, Ser. No. 590,653

1 Claim. (Cl. 117—217)

The present invention relates to a new and improved method for forming electrically conductive layers upon dielectric materials and particularly for thin film dielectric materials suitable for capacitor and printed circuit applications.

It is an object of the present invention to improve upon the presently used methods of forming electrically conductive strata upon inert non-conductive base materials. A further object of the invention is to achieve a process for the disposition of a conductive layer upon a resinous dielectric material at a temperature well below the temperature at which thermal degradation of the dielectric properties of the resinous film occurs. Further objects of the invention, as well as the advantages of it, will be apparent from the balance of the accompanying specification as well as the appended claim.

Prior to the present time, printed circuit components have been created by a variety of general methods. One of these is the direct printing or stencilling of a permanently conductive layer upon an inert base material. Another general approach involves the die-stamping of a conductive pattern upon a nonconductive base. Other procedures frequently used involve chemical or electrolytic etching of metal clad sheets. The deposition of conductive metal films of stable metals such as nickel and cobalt have been generally impractical by the use of conventional means such as vacuum deposition of the metal because the temperatures of condensation of these metals have proven so high as to thermally degrade the dielectric properties of resinous films such as polyethylene terephthalate, polystyrene, polyethylene and comparable resins as well as lacquer coated paper.

A highly satisfactory method which has been developed in the past pertains to the creation of a thin conductive layer of temporary characteristics as by printing upon the non-conductive base, and subsequently depositing over this first layer a second layer of a metal as by the use of an electrolytic bath. The second layer formed by this procedure is usually a comparatively thick conductive metal coating. This latter procedure works reasonably well in practice, but has the disadvantage that a separate electrolytic treatment is required. A further disadvantage is that the initial conductive coating employed, usually has a relatively high resistance causing the thickness of the second coating deposited upon it to vary depending upon the distance of the electrode attached to the first semipermanent coating.

Figure 1:
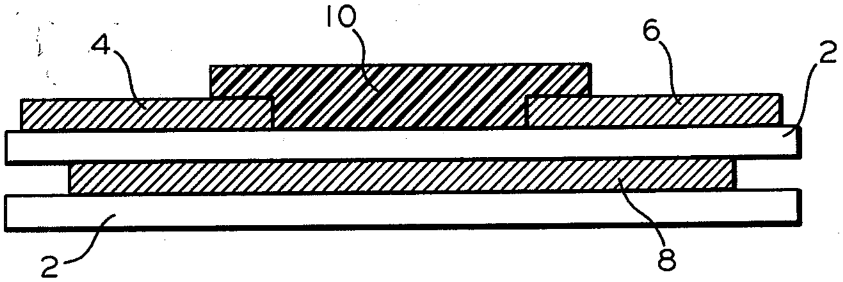
Figure 2:
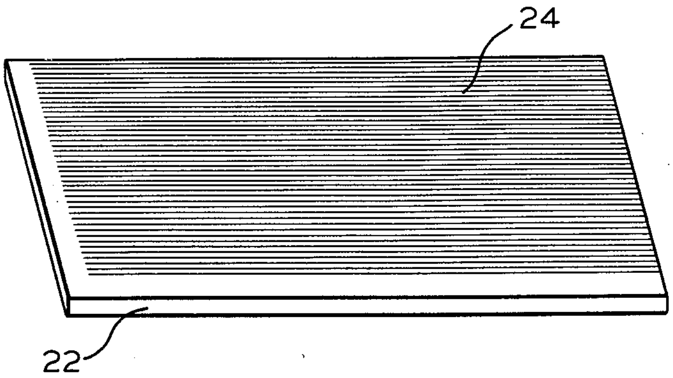

The appended drawing shows in Fig. 1 a cross-section of printed circuitry produced by this invention and in Fig. 2 a metallized resin film.

According to the present invention, a conductive layer on a dielectric material is created by first depositing on the dielectric material a decomposition catalytic material upon the insulating base in whatever configuration desired and then subsequently decomposing a nickel carbonyl compound upon this catalyst layer. The use of this process makes the fabrication of both printed circuitry comprising nickel conductive strata disposed on a resinous dielectric base in a predetermined configuration, said configuration including a pair of separated terminal points bridged by a printed resistor and a metallized resin film comprising a thin conductive stratum of nickel disposed on and supported by a resin such as polystyrene, polyethylene, polyethylene terephthalate and the phenolic types.

It will be readily seen by those skilled in the art that this procedure has the distinct advantages that no liquid immersion is required, and that the thickness of the metallic deposit is substantially uniform throughout all areas covered by the catalyst layers. In printed circuit applications, this catalyst material can be readily formed and handled in the same manner in which any ink-like composition is treated. Thus, there is no problem with the instant invention in forming extremely fine conductive layers corresponding to a precise pattern desired for any printed circuit type component. Where it is desired to fully coat the dielectric material such as would be used in self-healing type capacitor structures, the catalyst material can be readily disposed without masking upon the surface of the resin by various means including vacuum deposition and dip-coating the resin in a system having small particles of the catalytic material.

Metal carbonyls which can be employed with the present invention are quite well known to the art and have often been utilized for so-called gas-plating techniques of disposing a metal stratum upon another material through the thermal carbonyls as well as any of their properties, reference is made to the well known text "Structural Chemistry of Inorganic Compounds," by W. Huckel, volume 2, pages 503–515. The metal carbonyl which is used in the instant invention is nickel carbonyl because of its susceptibility to catalytic decomposition at much reduced temperatures. Other carbonyls come within the broad concept of this invention; however, for some reason not known, the use of catalytic means for the thermal decomposition of nickel carbonyl has proven unique both in the speed with which the metal layer is disposed upon the dielectric material and the reduced temperature at which satisfactory thermal decomposition obtains. Thus other suitable carbonyls include $CoH(CO)_4$, $Ru(CO)_5$, $RhH(CO)_4$, $Os(CO)_5$, $[Re(CO)_5]_2$, $[Co(CO)_4]_2$, $[Rh(CO)_4]_2$, $[Co(CO)_3]_4$, $[Ir(CO)_4]_2$ and $[Ru(CO)_3]_4$.

The catalysts which are suitable for the present invention appear to have a common property of finely divided form, that is they should be of such fineness so as to pass through about a 200 mesh screen. Among such finely divided catalysts which are suitable are nickel, cobalt, silver, gold, copper and the like. The decomposition catalysts also include particles of nickel carbonate. In general, temperatures of from 40 to 110° C. are utilized in decomposing the nickel carbonyl involved upon catalytic materials such as are indicated in this paragraph in contrast to the 130° C. and higher temperatures where the catalyst is not used. Further, it has been found that reduced pressures of carbon dioxide in the decomposition chamber is desirable which reduced pressures are in the order of from $10^{-4}$ to $10^{-2}$ millimeters of mercury.

Obviously, the deposition of the catalyst is of importance with the instant invention. In general, the catalyst particles should be as fine as can be conveniently obtained, and in no instance should they be larger than about 200 mesh. Such catalysts can be formed in the general method in which Raney nickel is formed. For certain applications, binder silicone resins, thermosetting plastics, such as for example, phenol formaldehyde condensation products, urea formaldehyde condensation products. Thermoplastic materials, such as, for example, polyethylene, polystyrene, polyvinyl butyrate, polyvinyl acetate, or the like can be employed as a binder with these catalysts. With these latter materials, it is best to use solvents such as butyl Cellosolve acetone, carbon tetrachloride or the like which are common in the industry. The presence of such materials as sulphur within the final catalyst composition applied to an inert base material should be avoided in view of the inhibiting tendency of such elements. Alternatively the catalytic agents can be disposed on the base member by vacuum means and dip-coating as previously set forth.

Obviously, the base materials which can be employed with the present invention are extremely varied. One preferred base material is phenol formaldehyde condensation resin. With this relatively inexpensive substance, the instant process has the distinct advantage that there is no charring or electrical degradation of the resin and that any printed circuit created upon this base substance may be dip-soldered if desired. Other dielectrics now capable of use with nickel conductive strata are such materials as paper, polytetrafluoroethylene, polytrifluoromonochloroethylene, cellulose acetate, cellulose butyrate and the like. Inorganic materials withstanding higher temperatures, such as for example, mica, steatite, and other related ceramics can, of course be used with the invention, although it is not necessary to employ such temperature resisting materials.

Referring now to Fig. 1, a diode filter utilizing a resin dielectric is shown in cross-section. The resin film 2 supports on one surface two conductive layers 4 and 6 bridged by a printed resistor 10. The layers 4 and 6 function as electrodes for two capacitors having a common electrode 8 which is the conductive stratum on the opposite surface of the dielectric 2. With a thermoplastic resin as polystyrene, polyethylene, etc., the assembly can be convolutely wound using a second resin film 2 (shown in Fig. 1) as the separating means. A metallized nickel coated resin film is pictorially shown in Fig. 2. Such composite structure of conductive strata and dielectric film is useful in both single (with appropriate configuration of the conductor) and multiple form as an electrostatic capacitor of exceptional operational stability.

For the purposes of illustration, only, as it is apparent that many embodiments of the invention are included within the scope of the appended claim, the following specific examples are set forth:

*Example I*

A ¼ mil thick 4" wide strip of linearly oriented polyethylene terephthalate was passed over a pot containing silver at a temperature of 1400° C. in an atmosphere of reduced pressure of $10^{-5}$ millimeters of mercury which resulted in a fine particulate coating of metallic silver upon the surface of the film. The silvered resinous film was passed through a chamber heated to a temperature of 110° C. containing nickel carbonyl generated by reacting mercury activated nickel powder with carbon monoxide. The nickel carbonyl decomposed at the silver coated surface of the polyethylene terephthalate film producing a dense nickel coating having a resistivity in the order of .5 ohm per square.

*Example II*

A .3 mil thick kraft paper web coated with a thermally cross-linked cellulose acetate sorbate coating was passed through an aqueous suspension of finely divided particles of nickel carbonate. The dip-coated paper was allowed to air dry to a water content of about 6%. Thereafter the coated web was placed in a chamber containing nickel carbonyl (produced as set forth in Example I) with the $CO_2$ partial pressure maintained at about $10^{-4}$ millimeters of mercury. It was found that at the temperature of 100° C. rapid deposition of a dense and uniform nickel coating occurs in less than one minute exposure which coating has a resistivity of about 0.5 ohm per square. Similarly non-self-supporting nickel conductive layers of this resistivity and less than 0.1 mil thickness can be obtained on polyethylene and 0.25 mil thick polystyrene films by maintaining the decomposition chamber between 94 and 96° C.

*Example III*

A diode filter circuit as shown in Fig. 1 can be produced by utilizing a 0.25 mil thick polystyrene film. On one surface of the resin masking it merely along the edges so as to provide a continuous surface for nickel deposition and thus fabricate the common electrode of Fig. 1. To the other masking is provided by imposing a strippable coating of lacquer (cellulose acetate) in an arrangement to provide two electrodes separated one from the other by a distance of approximately $\frac{1}{16}$". The masked film should be exposed in an atmosphere of reduced pressure, $10^{-5}$ millimeters of mercury, to the fine vapors of nickel over a nickel coated filament maintained at about 1900° C. The coating is virtually non-discernible and does not detectably electrically degrade the polystyrene. Thereafter, the so masked resin is coated on both surfaces by placing in a nickel carbonyl atmosphere at 95° C. and maintaining the $CO_2$ partial pressure at about $10^{-3}$ millimeters of mercury. The masking material is then removed, leaving dense adherent electrodes of nickel (resistivity about 0.6 ohm/square) supported on and adherent to the polystyrene. A printed resistor is imposed across the gap separating the electrodes on the one surface by appropriate screening of a resistance ink of epoxyline resin conducting carbon particles and filler of talc having the following formula:

| | Percent by weight |
|---|---|
| Epoxyline resin solids (Epon 1007 sold by Shell Oil Co.) | 38.5 |
| Carbon black | 5.1 |
| Talc | 5.0 |
| Diethylene triamine | 4.8 |
| Methyl ethyl ketone | 46.6 |

Partial curing was accomplished by holding the screened resistor at 50° C. for 20 minutes. Leads were secured to the electrodes and the assembly convolutely wound with a 0.1 mil thick cast polystyrene film to effect a compact diode filter having a resistance of 47,000 ohms and two capacitors of 50 mmfds. each. Final cure was effected by holding the wound assembly at 95° C. for five hours.

The advantages of my invention arise out of a means of coating to a useful thickness resinous dielectrics with high melting point, stable metals as nickel and cobalt without degradation of its electrical properties. The use of my invention thus means much lowered gas plating temperatures at a much higher rate and without an initiation period to effect a heavier deposit of the metal as nickel.

As many apparently widely different embodiments of my invention may be made without departing from the spirit and scope hereof, it is to be understood that my invention is not limited to the specific embodiments thereof except as defined in the appended claim.

This application forms a continuation-in-part of my copending application, Serial No. 352,063, filed April 29, 1953, and now abandoned.

I claim:

A process for producing a conductive layer on a heat sensitive dielectric material which comprises providing an inert electrically non-conductive base deleteriously affected by temperatures in excess of 110° C. with a particulate catalytic material in a layer of particles smaller than 200 mesh of a metal that catalyzes the decomposition of nickel carbonyl selected from the group consisting of nickel and silver, said particles being bonded in place by a resin and exposing the layer to the vapors of nickel carbonyl at a temperature of from 40° C. to 110° C., said temperature causing the metal particles to catalyze the decomposition of the carbonyl to deposit an electrically conductive stratum of the adherent nickel.

References Cited in the file of this patent

UNITED STATES PATENTS

| | | |
|---|---|---|
| 1,709,781 | De Boer et al. | Apr. 16, 1929 |
| 2,183,302 | Brauer | Dec. 12, 1939 |
| 2,344,138 | Drummond | Mar. 14, 1944 |
| 2,441,960 | Eisler | May 25, 1948 |
| 2,634,330 | Gaudio | Apr. 7, 1953 |
| 2,637,777 | Kilby et al. | May 5, 1953 |
| 2,698,812 | Schladitz | Jan. 4, 1955 |